(12) United States Patent
Konishi

(10) Patent No.: US 12,477,793 B2
(45) Date of Patent: Nov. 18, 2025

(54) SEMICONDUCTOR DEVICE AND POWER APPARATUS

(71) Applicant: Mitsubishi Electric Corporation, Tokyo (JP)

(72) Inventor: Kazuya Konishi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 496 days.

(21) Appl. No.: 17/923,233

(22) PCT Filed: May 29, 2020

(86) PCT No.: PCT/JP2020/021361
§ 371 (c)(1),
(2) Date: Nov. 4, 2022

(87) PCT Pub. No.: WO2021/240789
PCT Pub. Date: Dec. 2, 2021

(65) Prior Publication Data
US 2023/0163172 A1     May 25, 2023

(51) Int. Cl.
*H10D 62/13*     (2025.01)
*H02P 27/08*     (2006.01)
(Continued)

(52) U.S. Cl.
CPC ......... *H10D 62/137* (2025.01); *H10D 12/481* (2025.01); *H10D 62/393* (2025.01); *H02P 27/08* (2013.01)

(58) Field of Classification Search
CPC .... H10D 12/01; H10D 12/031; H10D 12/032; H10D 12/038; H10D 12/411;
(Continued)

(56) References Cited

U.S. PATENT DOCUMENTS

| | | | |
|---|---|---|---|
| 6,399,998 B1* | 6/2002 | Chang | H10D 62/393 257/586 |
| 2011/0233684 A1* | 9/2011 | Matsushita | H10D 64/117 257/E29.198 |

(Continued)

FOREIGN PATENT DOCUMENTS

| | | |
|---|---|---|
| CN | 102054859 A | 5/2011 |
| CN | 107949916 A | 4/2018 |

(Continued)

OTHER PUBLICATIONS

International Search Report and Written Opinion mailed on Aug. 4, 2020, received for PCT Application PCT/JP2020/021361, filed on May 29, 2020, 8 pages including English Translation.

(Continued)

*Primary Examiner* — Natalia A Gondarenko
(74) *Attorney, Agent, or Firm* — XSENSUS LLP

(57) ABSTRACT

A semiconductor device which reduces a concentration of the hole current on the upper-surface side. The semiconductor device includes a buffer layer of the first conductivity type, an upper-surface region on the upper-surface side from the buffer layer, and a lower-surface region on the lower-surface side from the buffer layer. A collector layer of the second conductivity type formed in the lower-surface region includes a first collector layer and a second collector layer with impurity concentration lower than that of the first collector layer, these two layers being formed alternately. The upper-surface region includes a first upper-surface region over the first collector layer and a second upper-surface region over the second collector layer. In the first upper-surface region, a hole discharge promoting structure is formed, which promotes hole discharge from the top of the first collector layer.

21 Claims, 12 Drawing Sheets

(51) Int. Cl.
*H10D 12/00* (2025.01)
*H10D 62/17* (2025.01)

(58) Field of Classification Search
CPC .. H10D 12/421; H10D 12/441; H10D 12/461; H10D 12/481; H10D 62/10; H10D 62/117; H10D 62/126; H10D 62/106; H10D 62/112; H10D 62/142; H10D 62/127; H10D 62/129; H10D 62/133; H10D 62/137; H10D 62/145; H10D 62/149; H10D 62/154; H10D 62/155; H10D 62/177; H10D 62/292; H10D 62/393; H10D 62/53; H10D 62/834; H10D 62/60; H10D 64/117; H10D 64/20; H10D 64/231; H10D 64/251; H10D 64/252; H10D 64/512; H10D 64/519; H10D 84/0123; H10D 84/0126; H10D 84/101; H10D 84/135; H10D 84/141; H10D 84/143; H10D 84/146; H10D 84/148; H10D 84/161; H10D 84/406; H10D 84/613; H10D 84/8312; H10D 89/601; H10D 89/611; H02P 27/08
USPC ..................... 257/133, 139, 140, 329, 655
See application file for complete search history.

(56) References Cited

U.S. PATENT DOCUMENTS

| | | | |
|---|---|---|---|
| 2015/0021657 A1* | 1/2015 | Ogura ................. | H10D 12/441 |
| | | | 257/139 |
| 2018/0083131 A1* | 3/2018 | Tamaki ............... | H10D 62/393 |
| 2018/0204909 A1* | 7/2018 | Konishi ............... | H10D 84/617 |
| 2018/0269063 A1* | 9/2018 | Kodama .............. | H01L 21/266 |
| 2018/0286943 A1* | 10/2018 | Naito .................. | H10D 62/127 |
| 2019/0051738 A1* | 2/2019 | Chen ................... | H10D 64/01 |
| 2019/0140091 A1* | 5/2019 | Kinoshita ........... | H10D 30/0297 |
| 2019/0148532 A1* | 5/2019 | Naito .................. | H10D 8/422 |
| | | | 257/330 |

FOREIGN PATENT DOCUMENTS

| | | |
|---|---|---|
| JP | 4566470 B2 | 10/2010 |
| JP | 2016-162948 A | 9/2016 |
| JP | 2017-79292 A | 4/2017 |
| JP | 2018-49866 A | 3/2018 |

OTHER PUBLICATIONS

Office Action issued Feb. 14, 2025 in Chinese Patent Application No. 202080100753.3, 17 pages.
Office Action issued Jun. 28, 2025 in corresponding Chinese patent application No. CN 202080100753.3 (13 pages; with English machine translation).

* cited by examiner

SEMICONDUCTOR DEVICE AND POWER APPARATUS

CROSS-REFERENCE TO RELATED APPLICATION

The present application is based on PCT filing PCT/JP2020/021361, filed May 29, 2020, the entire contents of which is incorporated herein by reference.

TECHNICAL FIELD

The present disclosure relates to a semiconductor device and a power apparatus, in particular, to an insulated gate bipolar transistor (IGBT) and a power converter using the IGBT.

BACKGROUND ART

In recent years, IGBTs have been widely used for home appliances represented by air conditioners and refrigerators, inverters for railway trains, and industrial robots requiring motor control, as these electrical machinery and appliances are advancing to be more power-efficient and compact. Noteworthy here is that in order to reduce power loss of power apparatuses for high-frequency applications (for example, power converter), reduction of turn-off loss of IGBTs is required.

For the reduction of turn-off loss of IGBTs, it is desirable to decrease a concentration of a p collector layer on a lower-surface side and thus to lower a hole injection amount from the lower-surface side. However, an excessive decrease in the concentration of the p collector layer causes a decrease in ohmic performance of a lower-side electrode, which leads to a significant increase in the turn-off loss. Thus, for example, Patent Document 1 discloses an IGBT having a $p^+$ type p collector layer and a $p^-$ type $p^-$ collector layer, both formed on the lower-surface side thereof. Also, Patent Document 2 discloses an IGBT having a $p^+$ type p collector layer and a $p^-$ type $p^-$ collector layer, both formed on the lower-surface side thereof, and not having an n type source layer on the region where the p collector layer is formed. The IGBT, disclosed in Patent Document 1 and Patent Document 2, having a collector layer including the p collector layer and the $p^-$ collector layer of concentration lower than that of the p collector layer, both formed on the lower-surface side, suppresses the hole injection amount to reduce the injection of hole, which leads to reduction of the turn-off loss without decreasing ohmic performance.

PRIOR ART DOCUMENTS

Patent Document

[Patent Document 1] Japanese Patent No. 4566470
[Patent Document 2] Unexamined Japanese Patent Application Publication No. 2018-49866

SUMMARY OF THE INVENTION

Problems to be Solved by the Invention

However, the inventor of the present disclosure found the following phenomenon that: in the IGBTs having the collector layers formed, which are disclosed in the prior literatures, a large amount of holes is unevenly accumulated on an upper-surface side of the p collector layer at the time of turn-off due to the difference in the hole injection amount between the p collector layer and the $p^-$ collector layer; thus, a concentration of a hole current, in which a density of the hole current increases, occurs; thus, a delay of hole discharge to an emitter electrode occurs at a concentration part of the hole current; and, as a result, the turn-off loss increases. According to the inventor, this phenomenon is more pronounced as the pitch of a pattern in which the p collector layer and the $p^-$ collector layer are placed is larger. For example, for a variety of 1200V withstand voltage, this phenomenon is more likely to occur at a pitch of 20 μm or lager and its effect is more pronounced at a pitch of 50 μm or larger.

On the other hand, if the difference in the hole injection amount between the p collector layer and the $p^-$ collector layer is made smaller by causing the concentration of the $p^-$ collector layer to be higher, the turn-off loss increases. It is therefore necessary to improve the concentration of the hole current in the upper-surface side where the hole discharge occurs, so that both the reduction of hole injection and the reduction of turn-off loss will be satisfied at the same time. However, in the conventional technique, there has been a problem that the density distribution of the hole current cannot be made uniform by reducing the concentration of the hole current.

The object of the present disclosure is to solve the above problem and thus to obtain a semiconductor device with improved concentration of the hole current in the upper-surface side over the p collector layer and a power apparatus using the semiconductor device, the improvement being made in consideration of the structure of the collector layer having in the lower-surface side the p collector layer and the $p^-$ collector layer, which is lower in concentration than the p collector layer.

Means for Solving Problem

A semiconductor device according to the present disclosure includes: a buffer layer of a first conductivity type; an upper-surface region on an upper-surface side from the buffer layer; and a lower-surface region on a lower-surface side from the buffer layer, wherein the upper-surface region includes: a drift layer of the first conductivity type formed on the buffer layer; a base layer of a second conductivity type formed over the drift layer; a source layer of the first conductivity type and a contact layer of the second conductivity type formed on the base layer to be adjoining each other; a plurality of trench gates formed penetrating thorough the source layer, the contact layer, and the base layer to reach the drift layer and extending with spaces therebetween; an emitter contact layer formed on the source layer and the contact layer; and an emitter electrode formed on the emitter contact layer, and the lower-surface region includes: a collector layer of the second conductivity type formed under the buffer layer; and a collector electrode formed under the collector layer, the collector layer including a first collector layer and a second collector layer formed alternately, the second collector layer having impurity concentration lower than that of the first collector layer, wherein the upper-surface region includes a first upper-surface region over the first collector layer and a second upper-surface region over the second collector layer, the second upper-surface region has a structure different from that of the first upper-surface region, and in the first upper-surface region, a hole discharge promoting structure to promote hole discharge from a region over the first collector layer compared to a case where the structure of the first upper-surface region is made identical to the structure of the second upper-surface region is formed.

A power apparatus according to the present disclosure includes the semiconductor device according to the present disclosure.

Effects of the Invention

According to the semiconductor device of the present disclosure, a hole discharge promoting structure is formed in accordance with the structure of the collector layer of the second conductivity type including the first collector layer, which is the P collector layer and the second collector layer, which is the p⁻ collector layer with low impurity concentration than that of the first collector layer. As a result, the hole discharge in a region over the first collector layer is promoted when compared with the case where the structure of the first upper-surface region is made the same as that of the second upper-surface region. This makes it possible to reduce the delay of the hole discharge caused by the concentration of the hole current in a region over the first collector layer and thus to reduce the turn-off loss at the concentration part of the hole current. The power apparatus according to the present disclosure, which includes the semiconductor device according to the present disclosure, can improve the loss reduction.

EMBODIMENTS FOR CARRYING OUT THE INVENTION

Hereinafter, the embodiments according to the present disclosure will be described with reference to the drawings. In the following embodiments, the same components are designated by the same symbols.

Embodiment 1

In the following description, regarding conductivity type of impurities, although the n type is defined as a first conductivity type and the p type is defined as a second conductivity type, these conductivity types may be interchanged with each other.

Figure 1:
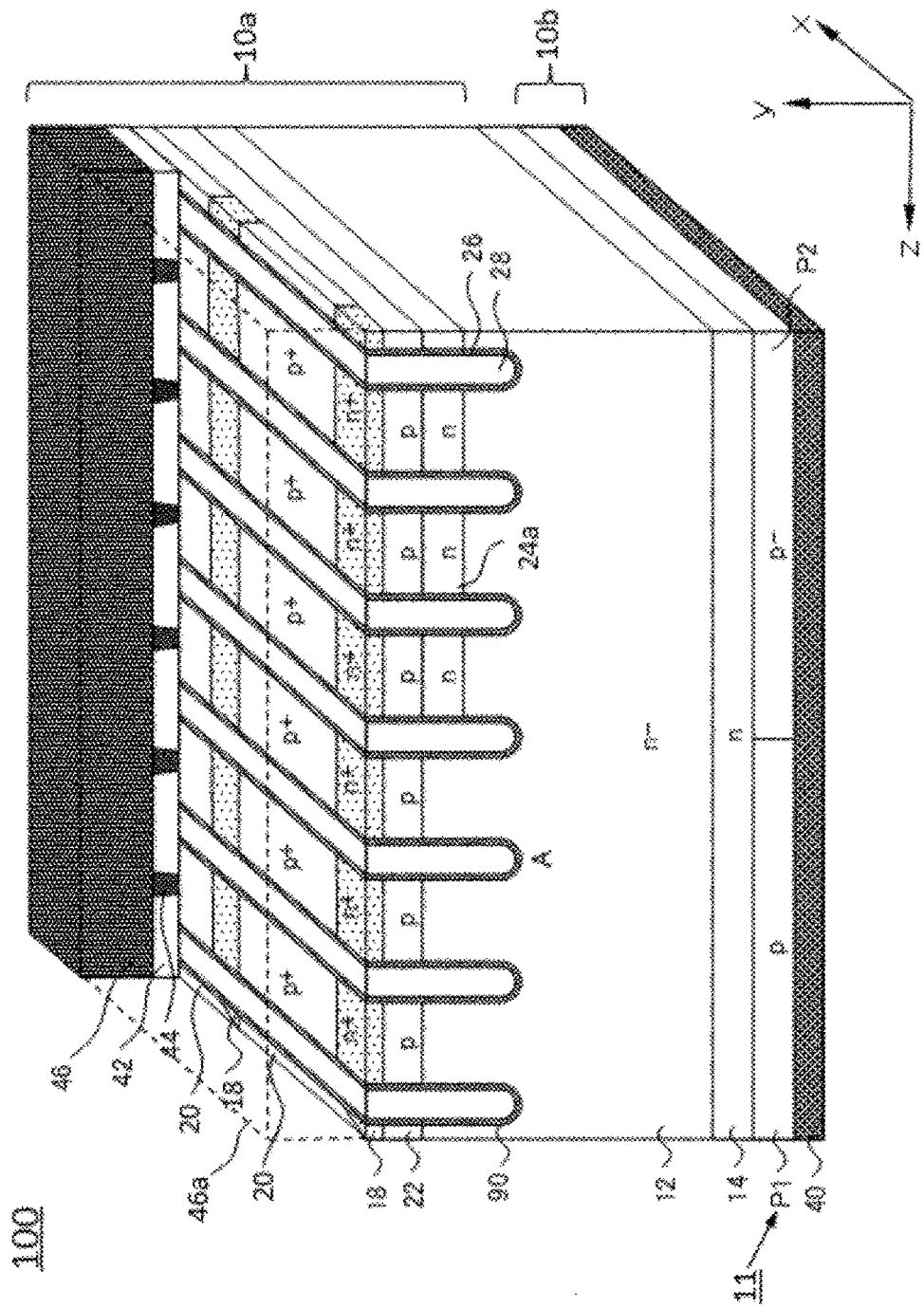
FIG. 1 is a cross-sectional perspective view showing a configuration of a semiconductor device according to Embodiment 1.
Figure 2:
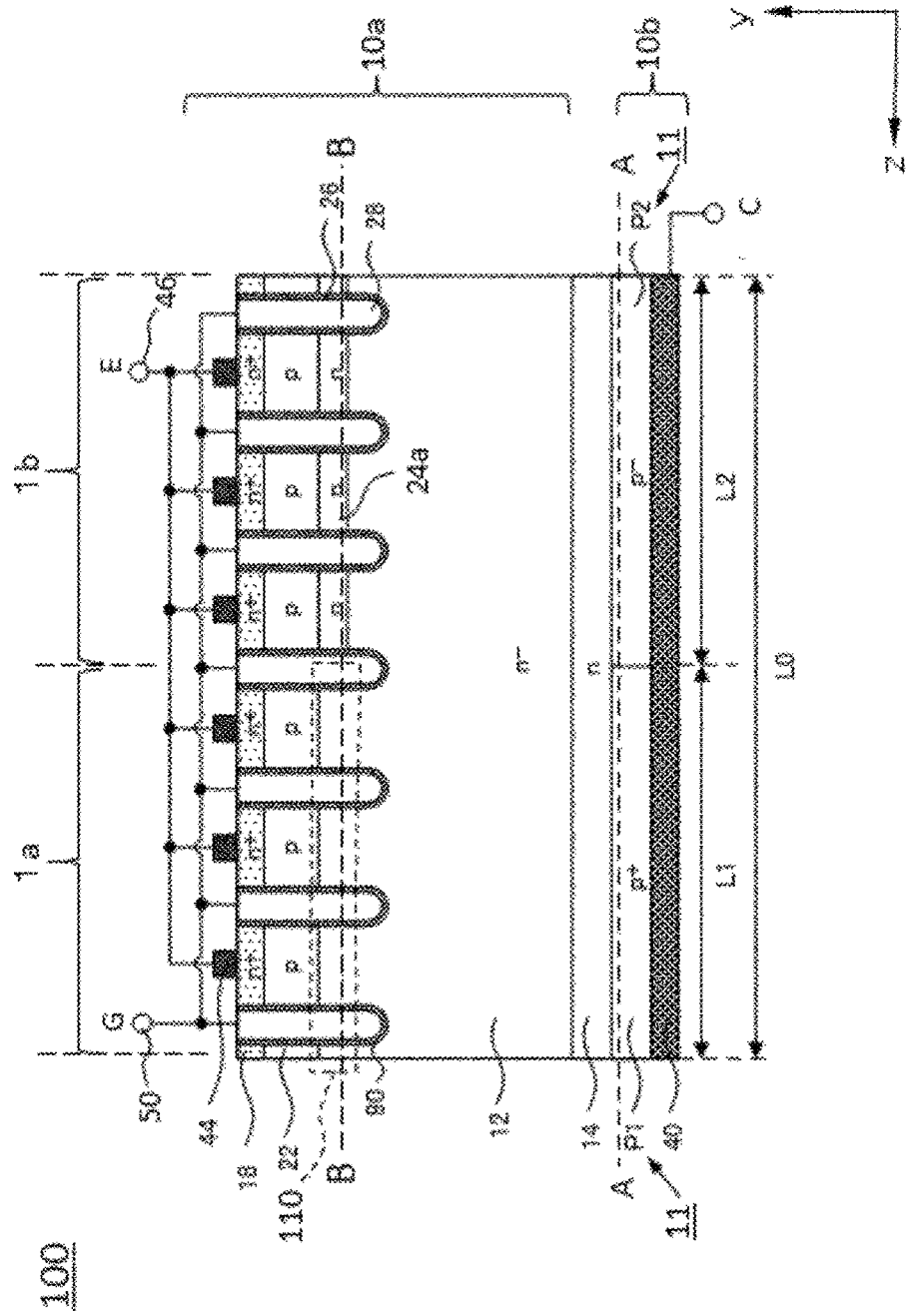
FIG. 2 is a cross-sectional view showing the structure of the semiconductor device according to Embodiment 1.

FIG. 1 is a cross-sectional perspective view showing part of a semiconductor device 100 according to Embodiment 1. FIG. 2 is a cross-sectional view showing part of the semiconductor device 100 according to Embodiment 1. The semiconductor device 100 is an IGBT.

As shown in FIG. 1 and FIG. 2, the semiconductor device 100 includes a buffer layer 14 of the first conductivity type, an upper-surface region 10a on an upper-surface side from the buffer layer 14, and a lower-surface region 10b on a lower-surface side from the buffer layer. The upper-surface region 10a includes: a drift layer 12 of the first conductivity type formed on the buffer layer 14; a base layer 22 of the second conductivity type formed on the drift layer 12; a source layer 18 of the first conductivity type and a contact layer 20 of the second conductivity type formed on the base layer 22 to be adjoining to each other; a plurality of trench gates 90 formed penetrating through the source layer 18, the contact layer 20, and the base layer 22 to reach the drift layer 12 and extending with spaces therebetween; an emitter contact layer 44 formed on the source layer 18 and the contact layer 20; and an emitter electrode 46 formed on the emitter contact layer 44.

The lower-surface region 10b includes a collector layer 11 of the second conductivity type formed under the buffer layer 14 and a collector electrode 40 formed under the collector layer 11. The collector layer 11 includes a first collector layer P1 and a second collector layer P2 with an impurity concentration lower than that of the first collector layer P1, these two collector layers P1 and P2 being provided alternately.

In Embodiment 1, the buffer layer 14 of the first conductivity type is a buffer layer of n type. The drift layer 12 of the first conductivity type is a drift layer of n⁻ type. The base layer 22 of the second conductivity type is a base layer of p type. The source layer 18 of the first conductivity type is a source layer of n⁺ type. The contact layer 20 of the second conductivity type is a contact layer of p⁺ type. In the collector layer 11 of the second conductivity type formed under the buffer layer 14, the first collector layer P1 is a p collector layer of p type and the second collector layer P2 is a p⁻ collector layer of p⁻ type. The impurity concentration in n⁺ type is higher than that in n type, and the impurity concentration in n type is higher than that in n⁻ type. The impurity concentration in p⁺ type is higher than that in p type, and the impurity concentration in p type is higher than that in p⁻ type.

In FIG. 1, x direction is the extending direction of the trench gates 90. Z direction orthogonal to x direction is an array direction of the trench gates 90 orthogonal to the extending direction of the trench gates 90. Y direction orthogonal to both x direction and z direction is a stacking direction of the semiconductor device 100. FIG. 2 is a cross-sectional view of the semiconductor device 100 in y-z directions perpendicular to x direction, which is the extending direction of the trench gates 90. In the following description, explanation will be made with definition that the positive direction of y direction in FIG. 1 is upward direction or upper-surface side direction, and the negative direction of y direction in FIG. 1 is downward direction or lower-surface side direction.

As shown in FIGS. 1 and 2, in the semiconductor device 100, the trench gates 90 are provided by forming stripes of trench grooves each penetrating through the source layer 18 and the base layer 22 to reach the drift layer 12, forming an insulating film 26 on the wall within each trench groove, and then embedding a conductor 28.

As shown in FIG. 1, the semiconductor device 100 includes an interlayer insulating film 42 formed on the contact layer 20 and the source layer 18. The emitter contact layer 44 is formed in openings provided in the interlayer insulating film 42 to be in contact with the contact layer 20 and the source layer 18. The emitter electrode 46, which is in contact with the emitter contact layer 44, is formed over the interlayer insulating film 42.

Note that, although the interlayer insulating film 42, the emitter contact layer 44, and the emitter electrode 46 are actually extended up to the dotted line 46a in the negative direction of x direction with the same structure, here in FIG. 1, the portion indicated by the dotted line 46a is omitted from the drawing to explain the trench gates 90, the contact layer 20, and the source layer 18. That is, the emitter contact layer 44 is in contact with the emitter electrode 46 on its top and the contact layer 20 and the source layer 18 on its bottom.

As mentioned above, in the semiconductor device 100 having the collector layer 11 including the first collector layer P1 and the second collector layer P2, the holes accumulate unevenly more in the upper-surface region 10a over the first collector layer P1 than over the second collector layer P2, so that the concentration of the hole current is likely to occur there. This causes, in a region over the first collector layer P1, a delay in the hole discharge to the emitter electrode on the upper-surface side due to the concentration of the hole current and thus an increase in the turn-off loss.

As shown in FIG. 2, the upper-surface region 10a includes a first upper-surface region 1a located above the first collector layer P1 and a second upper-surface region 1b located above the second collector layer P2. In order to improve the concentration of the hole current in the first upper-surface region 1a, the second upper-surface region 1b has a structure different from that of the first upper-surface region 1a in the upper-surface region 10a.

In Embodiment 1, a hole discharge promoting structure 110 is formed, which is a structure to promote the hole discharge from the top of the first collector layer P1 compared to the case where the structure of the first upper-surface region 1a is made identical to the structure of the second upper-surface region 1b. The hole discharge promoting structure according to the present disclosure accelerates the hole discharge in a region over the first collector layer P1 and thus reduces the delay of the hole discharge due to the high density of the hole current occurring in a region over the first collector layer P1, compared to the case where the structure of the first upper-surface region 1a is made identical to the structure of the second upper-surface region 1b.

Although a first carrier accumulation layer 24a of the first conductivity type with impurity concentration higher than that of the drift layer 12 is formed between the drift layer 12 and the base layer 22 in the second upper-surface region 1b, the hole discharge promoting structure 110 is a structure in which a first carrier accumulation layer 24a with impurity concentration higher than that of the drift layer 12 is not formed between the drift layer 12 and the base layer 22 in the first upper-surface region 1a. The trench gates 90 in the first upper-surface region 1a penetrate through the source layer 18, the contact layer 20, and the base layer 22 to reach the drift layer 12. The trench gates 90 in the second upper-surface region 1b penetrate through the source layer 18, the contact layer 20, the base layer 22, and the first carrier accumulation layer 24a to reach the drift layer 12.

Normally, the carrier accumulation layer acts as a barrier to the holes and has the effect of accumulating the holes. The hole discharge promoting structure 110 in the semiconductor device 100 according to Embodiment 1 is a structure that uses the hole barrier effect of the first carrier accumulation layer 24a. The first carrier accumulation layer 24a is provided to suppress the hole discharge in the second upper-surface region 1b.

In contrast, in the first upper-surface region 1a, the hole discharge is not suppressed because the first carrier accumulation layer 24a is not provided between the drift layer 12 and the base layer 22. That is, the hole discharge promoting structure 110 formed in the first upper-surface region 1a promotes the hole discharge and improves the delay of the hole discharge in a region over the first collector layer P1 compared to the case where the structure of the first upper-surface region 1a is made identical to the structure of the second upper-surface region 1b. This leads to the improvement of the concentration of the hole current in the first upper-surface region 1a and further to the reduction of the turn-off loss due to the delay of the hole discharge at the concentration part of the hole current.

As for the impurity concentration of the first collector layer P1, it suffices if the concentration is higher than that of the second collector layer P2. For example, it is within a range from $1\times10^{16}$ cm$^{-3}$ to $1\times10^{18}$ cm$^{-3}$. As for the impurity concentration of the second collector layer P2, it suffices if the concentration is lower than that of the first collector layer P1. For example, it is within a range from $1\times10^{15}$ cm$^{-3}$ to $5\times10^{17}$ cm$^{-3}$.

In the collector layer 11, a pitch L0 of the pattern where the first collector layer P1 and the second collector layer P2 are arranged is larger, for example, than 5 μm, the pitch L0 being a combined length of the width L1 of the first collector layer P1 and the width L2 of the second collector layer P2. Also, the concentration of the hole current in a region over the first collector layer P1, which is the problem to be solved in the present disclosure, is likely to occur on the upper-surface side of the first collector layer P1 as the pitch L0 is larger, so that the desirable range of the pitch L0 is 20 μm or larger. As for L1: L2, which is the ratio of the width L1 of the first collector layer P1 to the width L2 of the second collector layer P2, the hole injection amount can be suppressed more and thus the turn-off loss can be reduced more as L2 is larger than L1, so that it is desirable to give a larger L2 against L1. For example, L1: L2 is 0.4: 0.6 or larger, and preferably L1: L2 is 0.1: 0.9 or larger.

Figure 3:
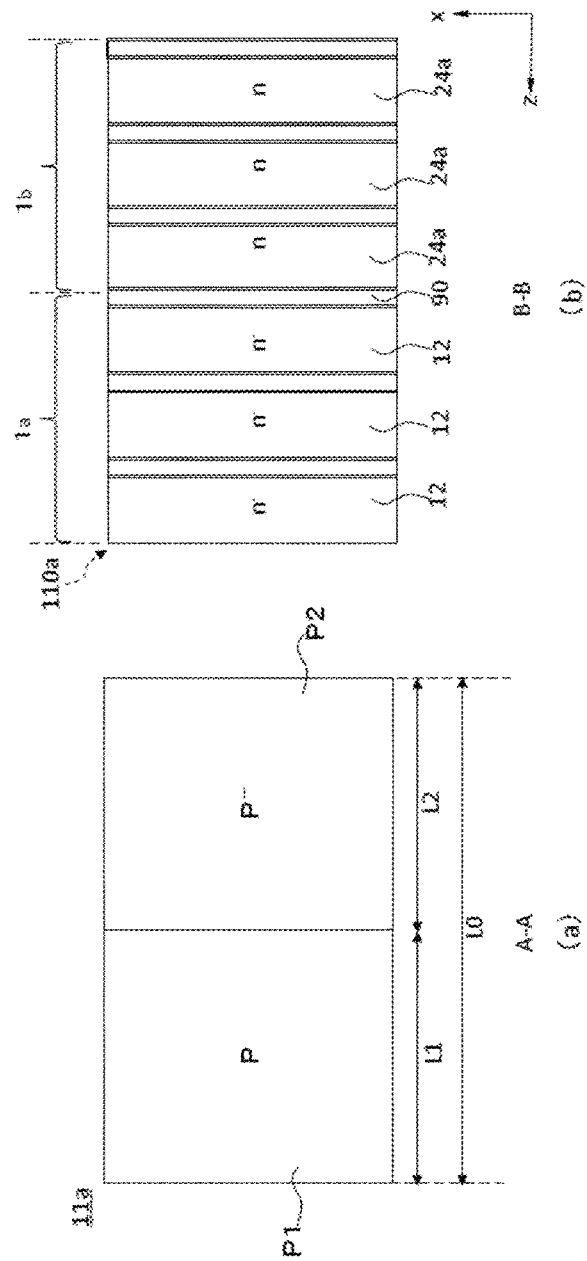
FIG. 3 is a plan view showing a layout pattern example of a collector layer and a hole discharge promoting structure of the semiconductor device according to Embodiment 1.
Figure 4:
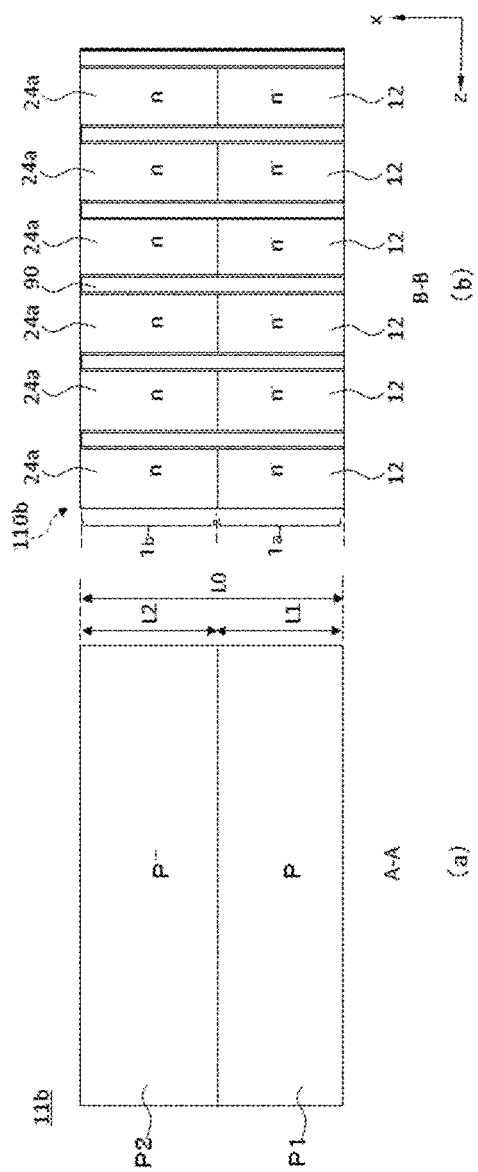
FIG. 4 is a plan view showing a layout pattern example of the collector layer and the hole discharge promoting structure of the semiconductor device according to Embodiment 1.
Figure 5:
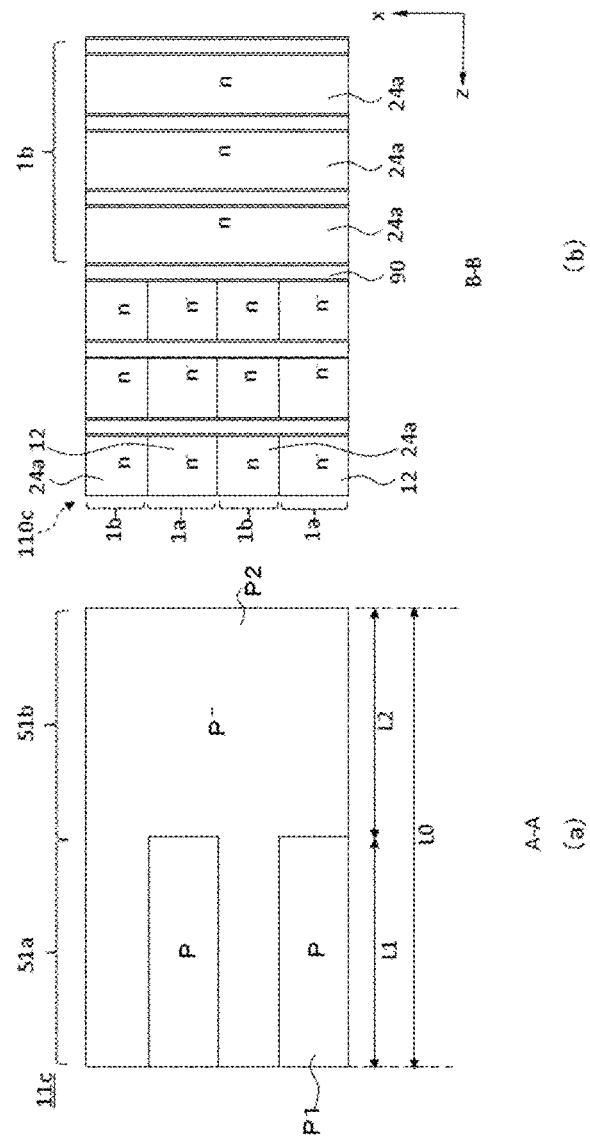
FIG. 5 is a plan view showing a layout pattern example of the collector layer and the hole discharge promoting structure of the semiconductor device according to Embodiment 1.

Next, a collector layer 11a, a collector layer 11b, and a collector layer 11c, which are examples of the pattern configuration of the first collector layer P1 and the second collector layer P2 in the collector layer, will be described with reference to FIG. 3, FIG. 4, and FIG. 5. FIG. 3, FIG. 4, FIG. 5 are a plan view in x-z directions along the extending direction of the trench gates 90 in the semiconductor device, showing a layout pattern example of the collector layer and the hole discharge promoting structure corresponding to the collector layer in the semiconductor device according to the present disclosure. In FIG. 3, FIG. 4, and FIG. 5, x direction is the extending direction of the trench gates 90 shown in FIG. 1. Z direction is the array direction of the trench gates 90 orthogonal to the extending direction of the trench gates 90.

FIG. 3(a) is a plan view in x-z directions at the position of the broken line A-A in FIG. 2, showing the layout pattern of the first collector layer P1 and the second collector layer P2 in the collector layer 11a. FIG. 3(b) is a plan view in x-z directions at the position of the broken line B-B in FIG. 2, showing the layout pattern of a hole discharge promoting structure 110a provided between the drift layer 12 and the base layer 22 corresponding to the layout of the collector layer 11a.

As shown in FIG. 3(a), in the collector layer 11a, the first collector layer P1 and the second collector layer P2 are formed alternately in z direction. In this case, the pitch L0 of the pattern where the first collector layer P1 and the second collector layer P2 are arranged in the collector layer 11a is a combined length of the width L1 of the first collector layer P1 and the width L2 of the second collector layer P2 in z direction shown in FIG. 3. Although the first carrier accumulation layer 24a is formed in the second upper-surface region 1b over the second collector layer P2, the hole discharge promoting structure 110a shown in FIG. 3(b) is a structure in which the first carrier accumulation layer 24a is not formed in the first upper-surface region 1a over the first collector layer P1. That is, in the plane at the B-B position shown in FIG. 3(b), there is the first carrier accumulation layer 24a at the position corresponding to the second collector layer P2 and there is the drift layer 12 at the position corresponding to the first collector layer P1.

FIG. 4(a) is a plan view at the position of the broken line A-A in FIG. 2, showing the layout pattern of the first collector layer P1 and the second collector layer P2 in the collector layer 11b. FIG. 4(b) is a plan view in x-z directions at the position of the broken line B-B in FIG. 2, showing the layout pattern of a hole discharge promoting structure 110b provided between the drift layer 12 and the base layer 22 corresponding to the layout of the collector layer 11b.

As shown in FIG. 4(a), the collector layer 11b has a pattern in which the first collector layer P1 and the second collector layer P2 are formed alternately in x direction. In this case, the pitch L0 of the pattern where the first collector layer P1 and the second collector layer P2 are arranged in the collector layer 11b is a combined length of the width L1 of the first collector layer P1 and the width L2 of the second collector layer P2 in x direction shown in FIG. 4. Although the first carrier accumulation layer 24a is formed in the second upper-surface region 1b over the second collector layer P2, the hole discharge promoting structure 110b shown in FIG. 4(b) is a structure in which the first carrier accumulation layer 24a is not formed in the first upper-surface region 1a over the first collector layer P1. That is, in the plane at the B-B position shown in FIG. 4(b), there is the first carrier accumulation layer 24a at the position corresponding to the second collector layer P2 and there is the drift layer 12 at the position corresponding to the first collector layer P1.

FIG. 5(a) is a plan view at the position of the broken line A-A in FIG. 2, showing the layout pattern of the first collector layer P1 and the second collector layer P2 in the collector layer 11c. FIG. 5(b) is a plan view in x-z directions at the position of the broken line B-B in FIG. 2, showing a hole discharge promoting structure 110c provided between the drift layer 12 and the base layer 22 corresponding to the layout of the collector layer 11c.

As shown in FIG. 5(a), the collector layer 11c includes a first collector region 51a and a second collector region 51b formed alternately in z direction. The first collector region 51a is a region in which the first collector layer P1 and the second collector layer P2 are formed alternately in x direction. The second collector region 51b is a region in which the first collector layer P1 is not formed and only the second collector layer P2 is formed. The pitch L0 of the pattern where the first collector layer P1 and the second collector layer P2 are arranged in the collector layer 11c is a combined length of the width L1 of the first collector layer P1 in the first collector region 51a and the width L2 of the second collector layer P2 in the second collector region 51b in z direction shown in FIG. 5.

In correspondence to FIG. 5(a), FIG. 5(b) shows the first upper-surface region 1a and the second upper-surface region 1b in the plane at the B-B position. Although the first carrier accumulation layer 24a is formed in the second upper-surface region 1b over the second collector layer P2, the hole discharge promoting structure 110c shown in FIG. 5(b) is a structure in which the first carrier accumulation layer 24a is not formed in the first upper-surface region 1a over the first collector layer P1. In the plane at the B-B position shown in FIG. 5(b), at the position corresponding to the first collector region 51a, the first upper-surface region 1a and the second upper-surface region 1b are alternately arranged in x direction. At the position corresponding to the second collector region 51b, there is the second upper-surface region 1b. That is, the drift layer 12 and the first carrier accumulation layer 24a are formed alternately in x direction over the first collector region 51a. In a region over the second collector region 51b where only the second collector layer P2 is formed, only the first carrier accumulation layer 24a is formed.

Next, an example of the production method for the semiconductor device 100 according to Embodiment 1 will be described.

First, a semiconductor substrate of the first conductivity type is prepared. Next, an oxidized film is formed as a mask on the semiconductor substrate, and a resist pattern is formed on the oxidized film by a photolithography method. The oxidized film is etched using the resist pattern as the mask. Next, the resist pattern is removed. Next, phosphorus (P) ions are injected to form a carrier accumulation layer of the first conductivity type using a mask. Next, the mask is removed, and another mask is made again. Then boron (B) ions are injected. Then, the injected phosphorus and boron are drive-diffused. Thus, the first carrier accumulation layer 24a of the first conductivity type and the base layer 22 of the second conductivity type are formed.

It suffices if the impurity concentration of the first carrier accumulation layer 24a is higher than that of the drift layer 12 and lower than that of the base layer 22. For example, the concentration is from $1 \times 10^{15}$ to $1 \times 10^{16}$ cm$^{-3}$. The diffusion depth in the first carrier accumulation layer 24a is 1.0 to 3.0 μm. In the base layer 22 of the second conductivity type, the surface concentration is, for example, $1 \times 10^{17}$ to $1 \times 10^{18}$ cm$^{-3}$ and the diffusion depth is, for example, 0.5 to 2.0 μm.

Next, using a mask made of oxidized film, arsenic (As) ions are injected as impurities, and the injected arsenic is drive-diffused. Thus, the source layer 18 of the first conductivity type is formed on the base layer 22 of the second conductivity type. In the source layer 18, the impurity concentration is, for example, $5 \times 10^{18}$ to $5 \times 10^{19}$ cm$^{-3}$ and the diffusion depth is, for example, 0.5 μm.

Next, the trench gates 90 are formed. The trench gates 90 are formed by dry etching using a mask made of oxidized film patterned so as to connect the trench gates to a gate electrode and formed in such a way that their trenches penetrate through the base layer 22 and the first carrier accumulation layer 24a. For example, the trenches each have a depth of 4.0 to 8.0 μm and a width of 0.5 to 2.0 μm. Next, the mask made of oxidized film is removed, and the insulating film 26, which is an oxidized film covering the side wall of each trench, is formed. Then, the trenches each covered by the insulating film 26 are filled with the conductor 28 such as polysilicon.

Next, the interlayer insulating film 42 made of oxidized film is formed to insulate the conductor 28 in the trenches. The thickness of the interlayer insulating film 42 is, for example, 0.5 to 3.0 μm. Next, the emitter contact layer 44 is formed using the mask made of oxidized film. Next, the emitter electrode 46 is formed. The material of the emitter electrode 46 is, for example, aluminum or aluminum-silicon. The thickness of the emitter electrode 46 is, for example, 0.5 to 5.0 μm. The gate electrode 50 insulated from the emitter electrode 46 is formed.

Next, P ions and B ions are injected to form the second collector layer P2 of the second conductivity type and the buffer layer 14 of the first conductivity type on the lower side of the semiconductor substrate. Then, B ions are injected to form the first collector layer P1 of the second conductivity type having a higher concentration compared to the second collector layer P2 in alternation with the second collector layer P2 on the lower side of the semiconductor substrate 10 using the mask made of oxidized film. Then the first collector layer P1, the second collector layer P2, and the buffer layer 14 are formed by annealing. Next, the collector electrode 40 is formed under the first collector layer P1 and the second collector layer P2. The material and thickness of the collector electrode 40 can be set as needed.

Next, a semiconductor device 101 according to a modification example of Embodiment 1 shown in FIG. 6 and a semiconductor device 102 according to a modification example of Embodiment 1 shown in FIG. 7 will be described.

Figure 6:
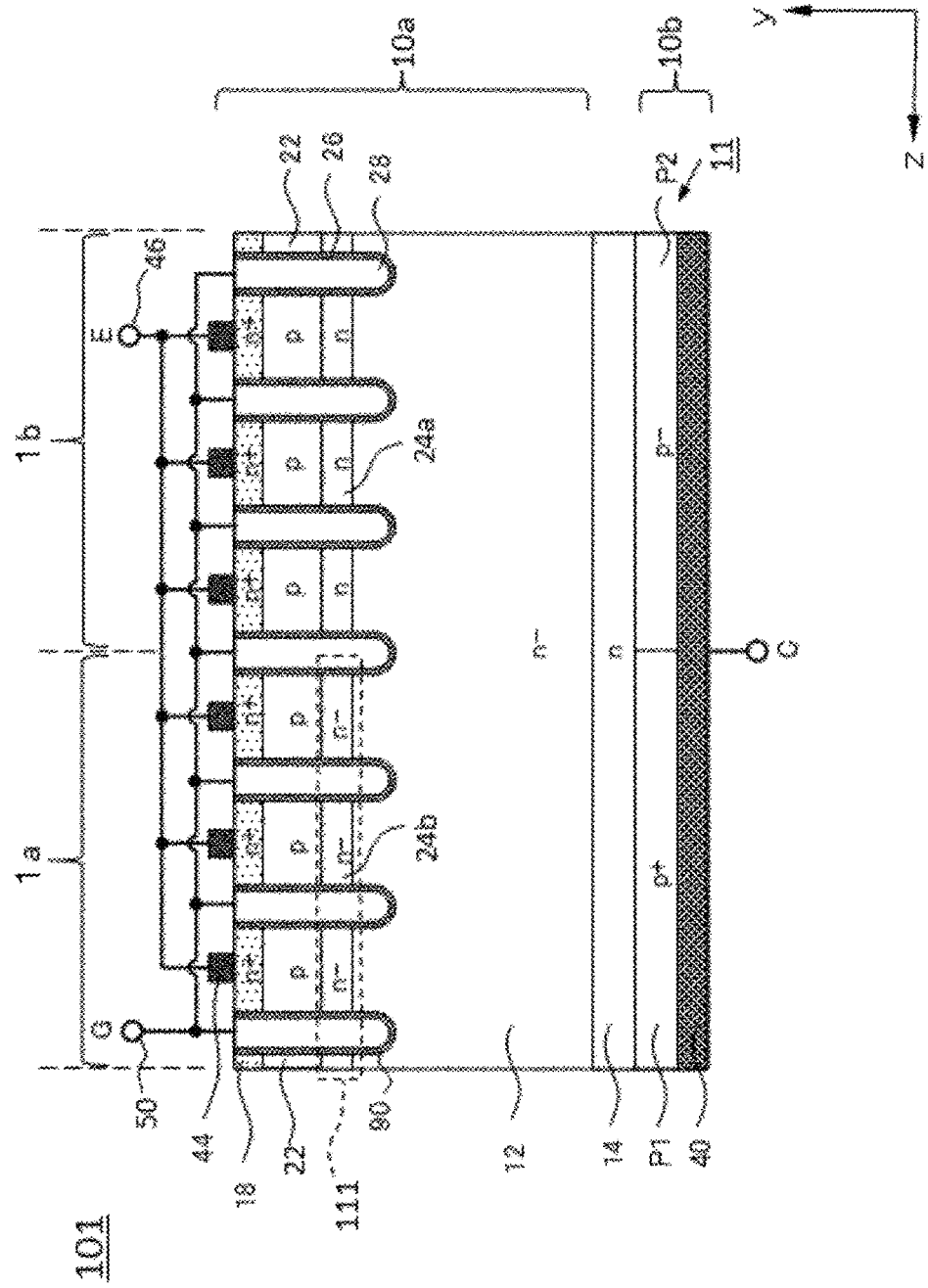
FIG. 6 is a cross-sectional view showing a configuration of a semiconductor device according to a modification example of Embodiment 1.

FIG. 6 shows a configuration of the semiconductor device 101 according to a modification example 1 of Embodiment 1 and is a cross-sectional view of the semiconductor device 101 in y-z directions perpendicular to the extending direction of the trench gates 90. As shown in FIG. 6, in the upper-surface region 10a of the semiconductor device 101 according to the modification example 1 of Embodiment 1, the second upper-surface region 1b over the second collector layer P2 has a structure different from that of the first upper-surface region 1a over the first collector layer P1. To improve the concentration of the hole current in the first upper-surface region 1a, a hole discharge promoting structure 111 is formed. Although the first carrier accumulation layer 24a of the first conductivity type with impurity concentration higher than that of the drift layer 12 is formed between the drift layer 12 and the base layer 22 in the second upper-surface region 1b, the hole discharge promoting structure 111 is a structure in which a second carrier accumulation layer 24b of the first conductivity type with impurity concentration lower than that of the first carrier accumulation layer 24a and higher than that of the drift layer 12 is formed between the drift layer 12 and the base layer 22 in the first upper-surface region 1a.

Compared to the second carrier accumulation layer 24b in the first upper-surface region 1a, the first carrier accumulation layer 24a in the second upper-surface region 1b accumulates more holes and suppresses the hole discharge. That is, like the hole discharge promoting structure 110, the hole discharge promoting structure 111 formed in the first upper-surface region 1a of the semiconductor device 101 promotes the hole discharge and improves the delay of the hole discharge in a region over the first collector layer P1 compared to the case where the structure of the first upper-surface region 1a is made identical to the structure of the second upper-surface region 1b.

Figure 7:
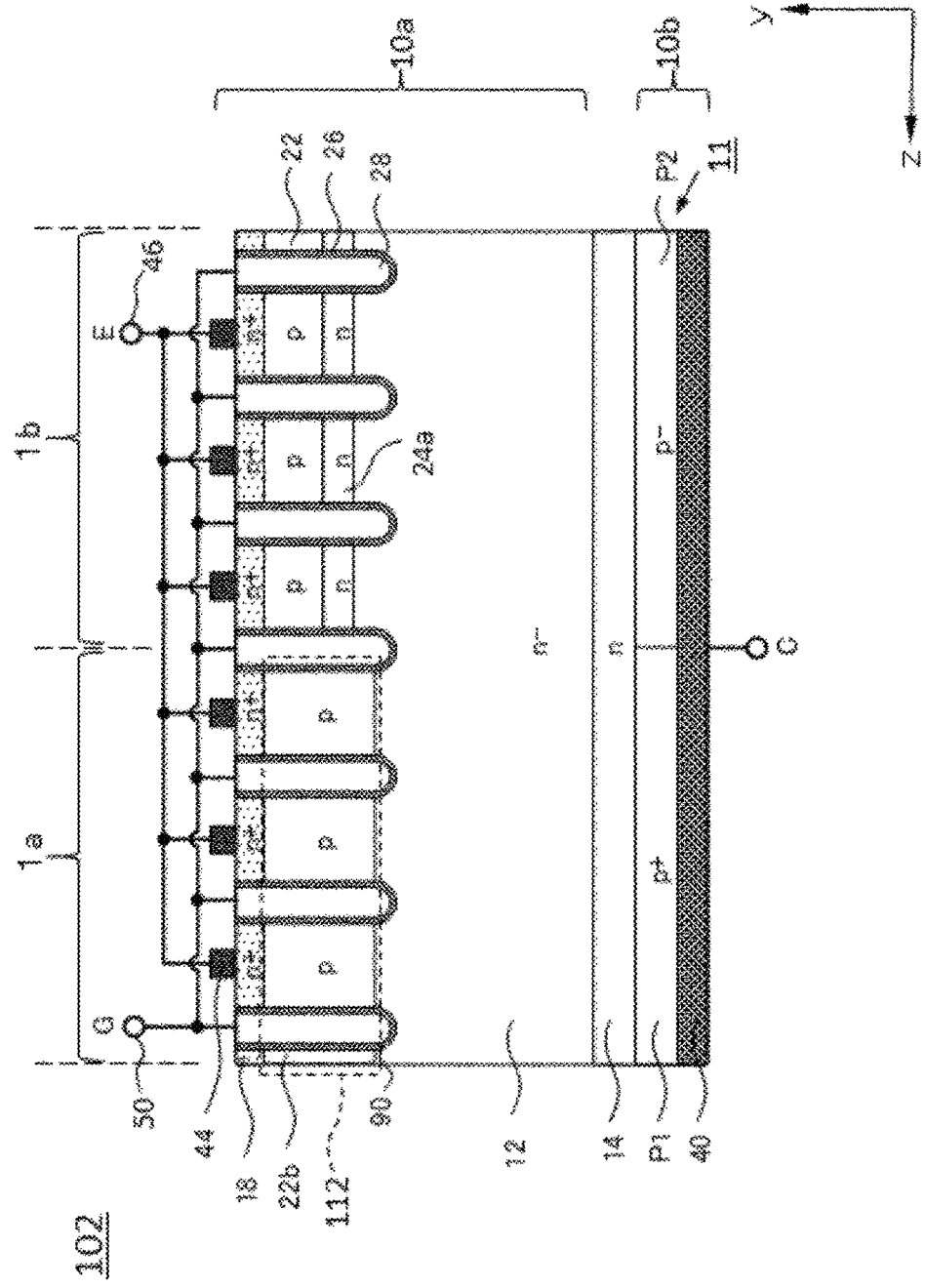
FIG. 7 is a cross-sectional view showing a configuration of a semiconductor device according to a modification example of Embodiment 1.

FIG. 7 shows a configuration of the semiconductor device 102 according to a modification example 2 of Embodiment 1 and is a cross-sectional view of the semiconductor device 102 in y-z directions perpendicular to the extending direction of the trench gates 90. As shown in FIG. 7, in the upper-surface region 10a of the semiconductor device 102 according to the modification example 2 of Embodiment 1, the second upper-surface region 1b over the second collector layer P2 has a structure different from that of the first upper-surface region 1a over the first collector layer P1. To improve the concentration of the hole current in the first upper-surface region 1a, a hole discharge promoting structure 112 is formed. Although the first carrier accumulation layer 24a of the first conductivity type with impurity concentration higher than that of the drift layer 12 is formed between the drift layer 12 and the base layer 22 in the second upper-surface region 1b, the hole discharge promoting structure 112 is a structure in which a deep base layer 22b deeper than the base layer 22 over the drift layer 12 in the second upper-surface region 1b is formed over the drift layer 12 in the first upper-surface region 1a.

As the base layer of the first conductivity type is deeper, the hole discharge effect is greater. With the deep base layer 22b formed in the first upper-surface region 1a, the hole discharge is promoted. On the other hand, the first carrier accumulation layer 24a in the second upper-surface region 1b is effective in accumulating the holes and suppressing the hole discharge. That is, like the hole discharge promoting structure 110, the hole discharge promoting structure 112 formed in the first upper-surface region 1a of the semiconductor device 102 promotes the hole discharge and improves the delay of the hole discharge in a region over the first collector layer P1 compared to the case where the structure of the first upper-surface region 1a is made identical to the structure of the second upper-surface region 1b.

In the semiconductor device according to Embodiment 1, the first carrier accumulation layer 24a with impurity concentration higher than that of the drift layer 12 is formed between the drift layer 12 and the base layer 22 in the second upper-surface region 1b. In contrast, the hole discharge promoting structure that improves the concentration of the hole current in the first upper-surface region 1a is a structure in which the first carrier accumulation layer 24a is not formed between the drift layer 12 and the base layer 22 in the first upper-surface region 1a. Therefore, the hole discharge in a region over the first collector layer P1 is promoted compared to the case where the structure of the first upper-surface region 1a is made identical to the structure of the second upper-surface region 1b. This makes it possible to reduce the delay of the hole discharge caused by the concentration of the hole current in a region over the first collector layer P1 and thus to reduce the turn-off loss at the concentration part of the hole current.

Embodiment 2

In Embodiment 2, the same symbols are used for the components that are identical to those in Embodiment 1 of the present disclosure, and descriptions of identical or corresponding parts are omitted. In the following, a semiconductor device 200 according to Embodiment 2 and a semiconductor device 201 according to a modification example of Embodiment 2 will be described with reference to the drawings.

Figure 8:
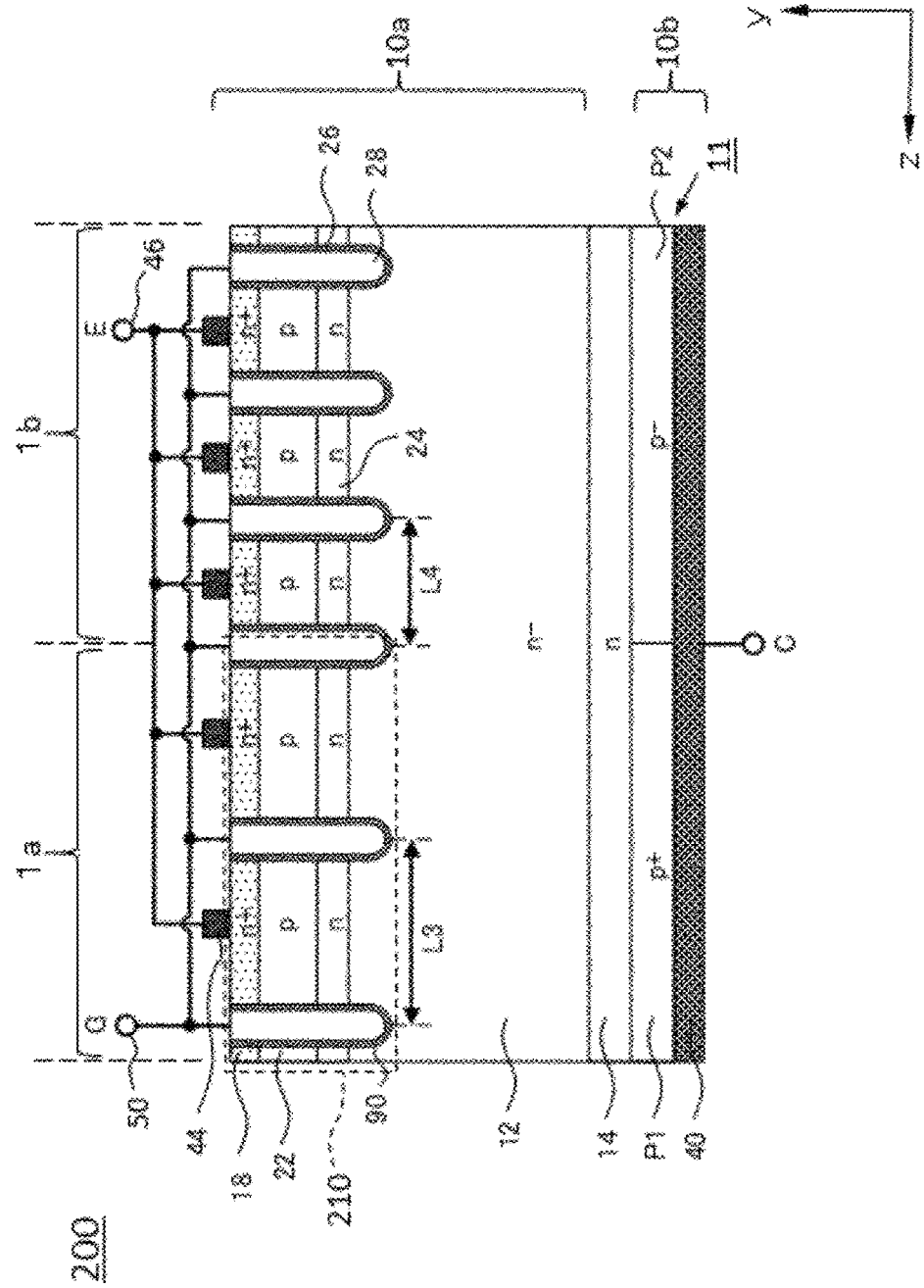
FIG. 8 is a cross-sectional view showing a configuration of a semiconductor device according to Embodiment 2.

FIG. 8 shows a configuration of the semiconductor device 200 according to Embodiment 2 and is a cross-sectional view of the semiconductor device 200 in y-z directions perpendicular to the extending direction of the trench gates 90. As shown in FIG. 8, in the upper-surface region 10a of the semiconductor device 200, in both the first upper-surface region 1a and the second upper-surface region 1b, the carrier accumulation layer 24 of the first conductivity type with impurity concentration higher than that of the drift layer 12 is formed between the drift layer 12 and the base layer 22.

In the semiconductor device 200 according to Embodiment 2, in the first upper-surface region 1a, a hole discharge promoting structure 210 is formed, which is a structure to promote the hole discharge from the top of the first collector layer P1 compared to the case where the structure of the first upper-surface region 1a is made identical to the structure of the second upper-surface region 1b. The hole discharge promoting structure 210 is a structure in which first trench pitches L3, which is the spaces between the trench gates 90 in the first upper-surface region 1a, are formed larger than second trench pitches L4, which is the spaces between the trench gates 90 in the second upper-surface region 1b.

For example, if each second trench pitch L4 is 1 in a region over the second collector layer P2, then each first trench pitch L3 is 2 to 3 in terms of ratio in a region over the first collector layer P1. Widening the trench pitches, which are the spaces between the trench gates, expands the routes of the hole discharge and thus promotes the hole discharge. The hole discharge promoting structure 210 promotes the hole discharge and improves the delay of the hole discharge in a region over the first collector layer P1 compared to the case where the structure of the first upper-surface region 1a is made identical to the structure of the second upper-surface region 1b.

Figure 9:
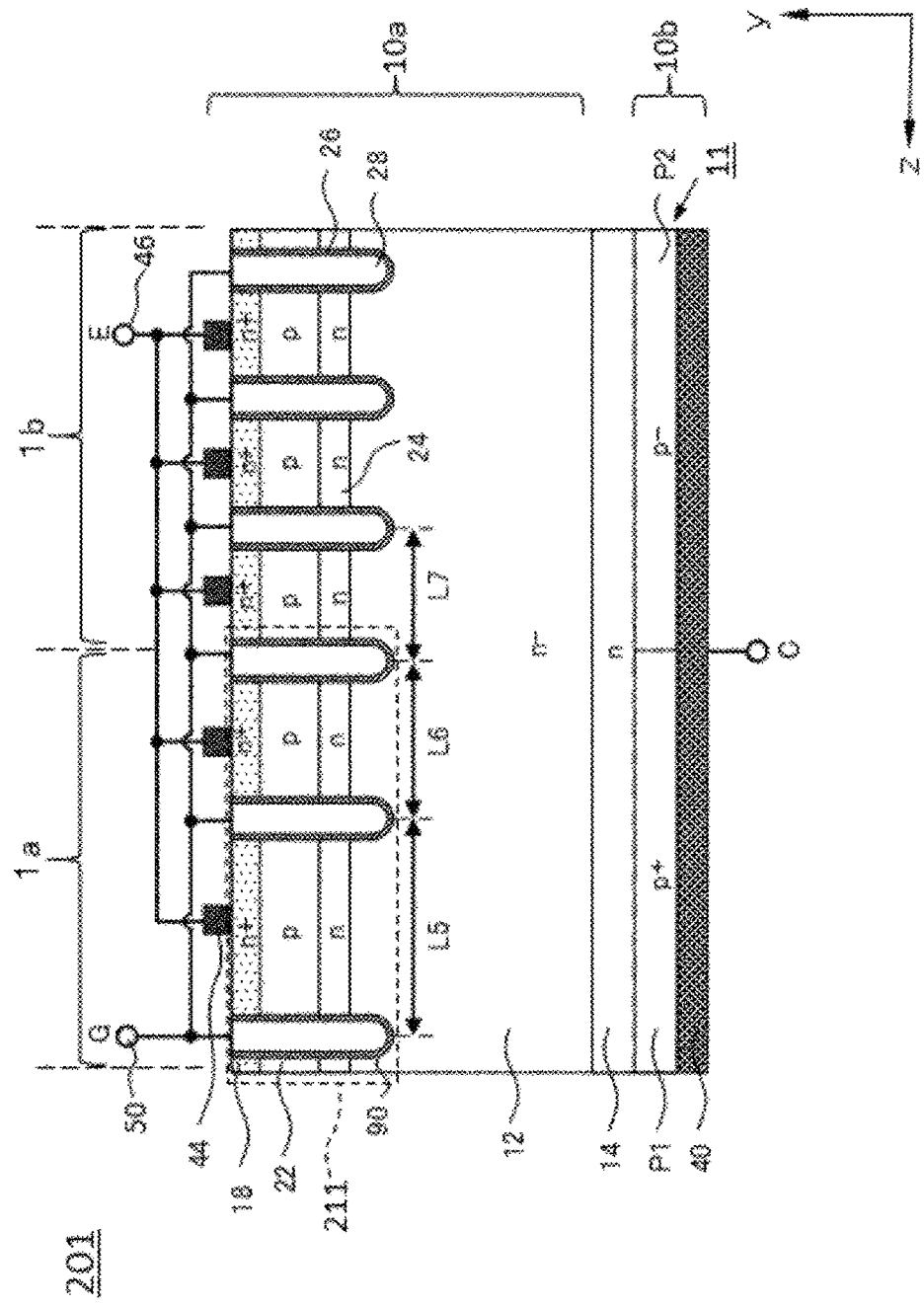
FIG. 9 is a cross-sectional view showing a configuration of a semiconductor device according to a modification example of Embodiment 2.

FIG. 9 shows a configuration of the semiconductor device 201 according to a modification example of Embodiment 2 and is a cross-sectional view of the semiconductor device 201 in y-z directions perpendicular to the extending direction of the trench gates 90. As shown in FIG. 9, in the upper-surface region 10a of the semiconductor device 201, the carrier accumulation layer 24 of the first conductivity type with impurity concentration higher than that of the drift layer 12 is formed between the drift layer 12 and the base layer 22 over both the first collector layer P1 and the second collector layer P2.

A hole discharge promoting structure 211 formed in the first upper-surface region 1a of the semiconductor device 201 according to the modification example of Embodiment 2 is a structure in which the first trench pitches, which are the spaces between the trench gates 90 in a region over the first collector layer P1, are formed larger than the second trench pitches, which are the spaces between the trench gates 90 in a region over the second collector layer P2 and formed narrower step by step in the direction from the first collector layer P1 to the second collector layer P2. That is, the relationship L5>L6>L7 holds among a first trench pitch L5 and a first trench pitch L6, which are the first trench pitches on the first collector layer P1 side, and a second trench pitch L7 on the second collector layer P2 side.

With the first trench pitches formed larger than the second trench pitches, the hole discharge promoting structure 211 promotes, like the hole discharge promoting structure 210, the hole discharge and improves the delay of the hole discharge in a region over the first collector layer P1 compared to the case where the structure of the first upper-surface region 1a is made identical to the structure of the second upper-surface region 1b. Furthermore, with the structure in which the first trench pitches narrow step by step in the direction from the first collector layer P1 to the second collector layer P2, the density of the hole current tends to decrease step by step in the direction from the first collector layer P1 to the second collector layer P2, which leads to an improvement of the ununiformity of the density distribution in the hole current.

With the hole discharge promoting structure 210 or the hole discharge promoting structure 211 formed in the first upper-surface region 1a, the semiconductor device according to Embodiment 2 makes it possible, as in Embodiment 1, to reduce the delay of the hole discharge caused by the concentration of the hole current in a region over the first collector layer P1 and thus to reduce the turn-off loss at the concentration part of the hole current.

Embodiment 3

In Embodiment 3, the same symbols are used for the components that are identical to those in Embodiment 1 of the present disclosure, and descriptions of identical or corresponding parts are omitted. In the following, a semiconductor device 300 according to Embodiment 3 will be described with reference to the drawings.

Figure 10:
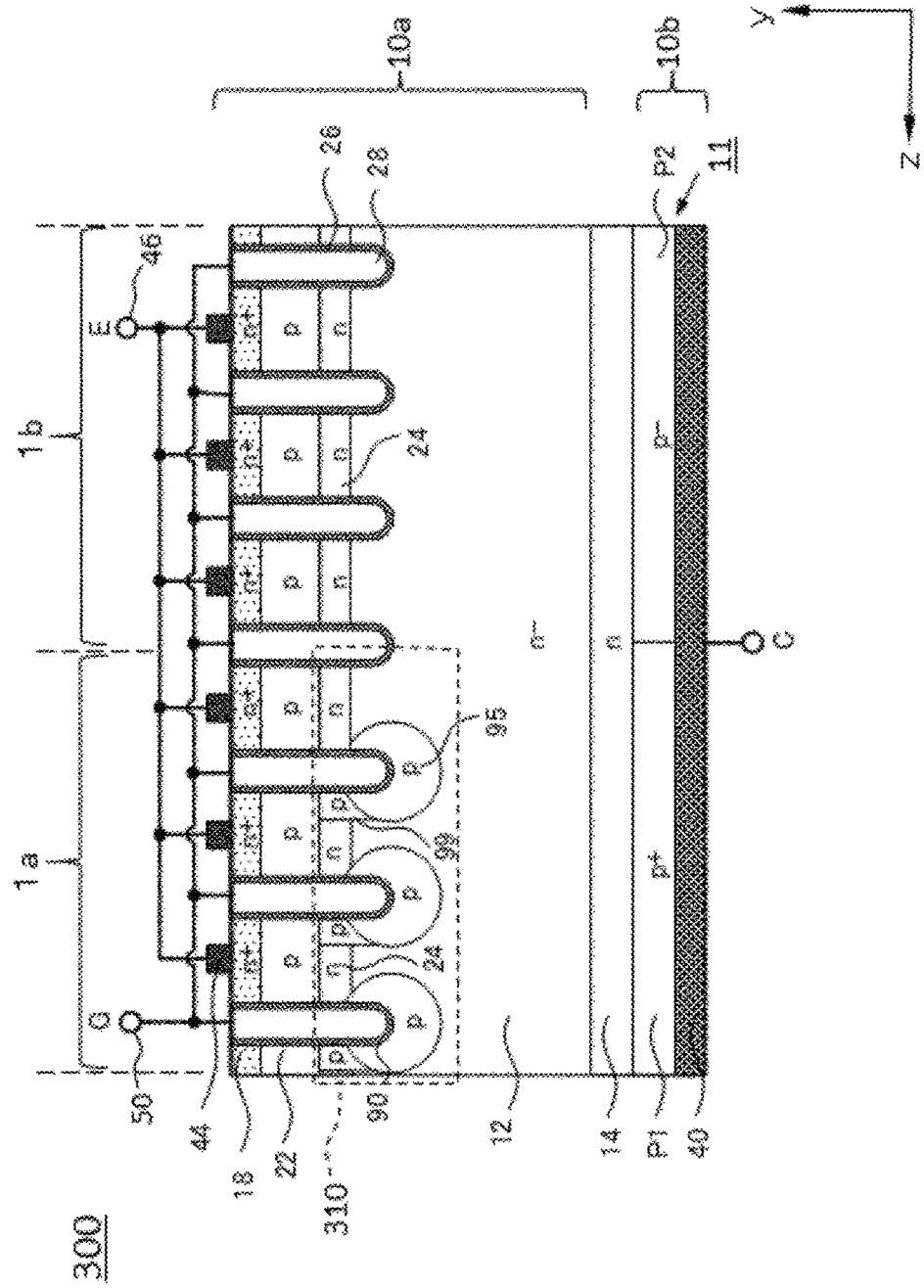
FIG. 10 is a cross-sectional view showing a configuration of a semiconductor device according to Embodiment 3.

FIG. 10 shows a configuration of the semiconductor device 300 according to Embodiment 3 and is a cross-sectional view of the semiconductor device 300 in y-z directions perpendicular to the extending direction of the trench gates 90. As shown in FIG. 10, in the upper-surface region 10a of the semiconductor device 300 according to Embodiment 3, in both the first upper-surface region 1a and the second upper-surface region 1b, the carrier accumulation layer 24 of the first conductivity type with impurity concentration higher than that of the drift layer 12 is formed between the drift layer 12 and the base layer 22.

In the semiconductor device 300 according to Embodiment 3, in the first upper-surface region 1a, a hole discharge promoting structure 310 is formed, which is a structure to promote the hole discharge from the top of the first collector layer P1 compared to the case where the structure of the first upper-surface region 1a is made identical to the structure of the second upper-surface region 1b. The hole discharge promoting structure 310 is a structure in which, in a region over the first collector layer P1, a bottom layer 95 of the second conductivity type is formed at the bottom of each trench gate 90 and a side wall layer 99 of the second conductivity type is formed on the sidewall of each trench gate 90. In contrast, neither bottom layer 95 of the second conductivity type nor side wall layer 99 of the second conductivity type is formed for the trench gates 90 in the second upper-surface region 1b.

The bottom layer 95 is connected to the base layer 22 between the trench gates 90 via the side wall layer 99 and connected to the emitter electrode 46 via the base layer 22. The holes are discharged to the emitter electrode 46 also through the bottom layer 95 at the bottom of each trench gate 90 in the first upper-surface region 1a. The hole discharge promoting structure 310 increases the hole discharge routes in a region over the first collector layer P1, thereby promoting the hole discharge and improving the delay of the hole discharge in a region over the first collector layer P1 compared to the case where the structure of the first upper-surface region 1a is made identical to the structure of the second upper-surface region 1b.

With the hole discharge promoting structure 310 formed in the first upper-surface region 1a, the semiconductor device according to Embodiment 3 makes it possible, as in Embodiment 1, to reduce the delay of the hole discharge caused by the concentration of the hole current in a region over the first collector layer P1 and thus to reduce the turn-off loss at the concentration part of the hole current.

Embodiment 4

In Embodiment 4, the same symbols are used for the components that are identical to those in Embodiment 1 of the present disclosure, and descriptions of identical or corresponding parts are omitted. In the following, a semiconductor device 400 according to Embodiment 4 will be described with reference to the drawings.

Figure 11:
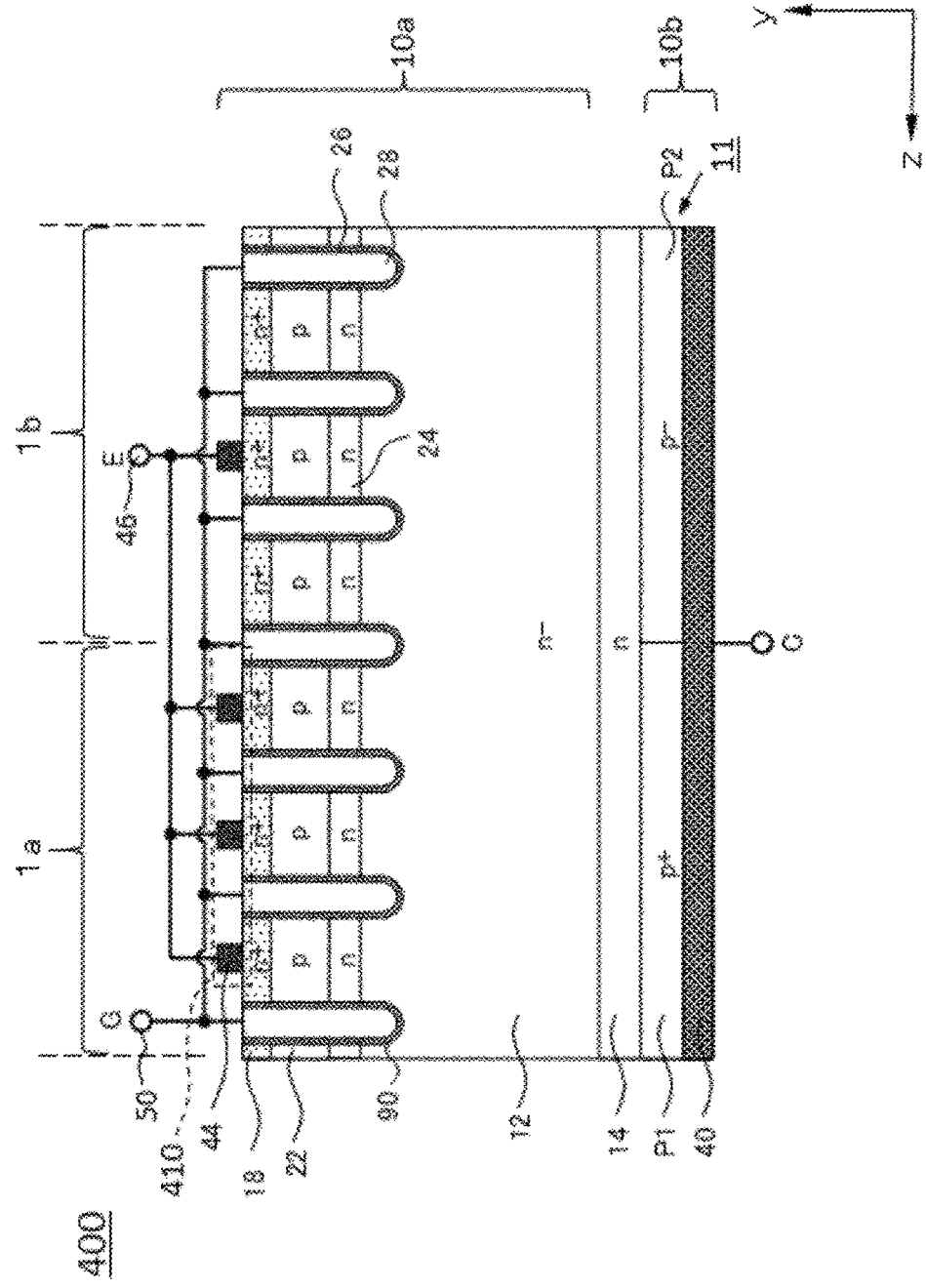
FIG. 11 is a cross-sectional view showing a configuration of a semiconductor device according to Embodiment 4.

FIG. 11 shows a configuration of the semiconductor device 400 according to Embodiment 4 and is a cross-sectional view of the semiconductor device 400 in y-z directions perpendicular to the extending direction of the trench gates 90. As shown in FIG. 11, in the upper-surface region 10a of the semiconductor device 400 according to Embodiment 4, in both the first upper-surface region 1a and the second upper-surface region 1b, the carrier accumulation layer 24 of the first conductivity type with impurity concentration higher than that of the drift layer 12 is formed between the drift layer 12 and the base layer 22.

In the semiconductor device 400 according to Embodiment 4, in the first upper-surface region 1a, a hole discharge promoting structure 410 is formed, which is a structure to promote the hole discharge from the top of the first collector layer P1 compared to the case where the structure of the first upper-surface region 1a is made identical to the structure of the second upper-surface region 1b. The hole discharge promoting structure 410 is a structure in which the number of the emitter contact layers 44 in the first upper-surface region 1a is larger than the number of the emitter contact layers 44 in the second upper-surface region 1b.

The holes are discharged via the emitter contact layers 44 to the emitter electrode 46. The increase in the number of the emitter contact layers 44 promotes the hole discharge. The hole discharge promoting structure 410 is a structure in which the number of the emitter contact layers 44, which are the discharge routes of the holes, is increased in the first upper-surface region 1a compared to the second upper-surface region 1b, thereby promoting the hole discharge and improving the delay of the hole discharge in a region over the first collector layer P1 compared to the case where the structure of the first upper-surface region 1a is made identical to the structure of the second upper-surface region 1b.

Note that the emitter contact layers 44 in a region over the second collector layer P2 may be thinned out not only in the array direction of the trench gates 90, which is z direction shown in FIG. 11, but also in the extending direction of the trench gates 90, which is x direction (not shown) perpendicular to the paper.

With the hole discharge promoting structure 410 formed in the first upper-surface region 1a, the semiconductor device according to Embodiment 4 makes it possible, as in Embodiment 1, to reduce the delay of the hole discharge caused by the concentration of the hole current in a region over the first collector layer P1 and thus to reduce the turn-off loss at the concentration part of the hole current.

Embodiment 5

Embodiment 5 describes an example in which a semiconductor device according to any one of Embodiment 1 through Embodiment 4 above is applied to a power converter, which is a power apparatus for high frequency applications. Although the present disclosure is not limited to a specific power converter, Embodiment 5 below describes an application of the present disclosure to a three-phase inverter. In a case where a semiconductor device according to any one of Embodiments 1 through 4 is applied to the power converter as described above, the hole discharge promoting structure provided in the semiconductor device according to any one of Embodiments 1 through 4 reduces the delay of the hole discharge caused by the heterogeneity of the density distribution in the hole current in the semiconductor device and thus reduces the turn-off loss at the concentration part of the hole current.

Figure 12:
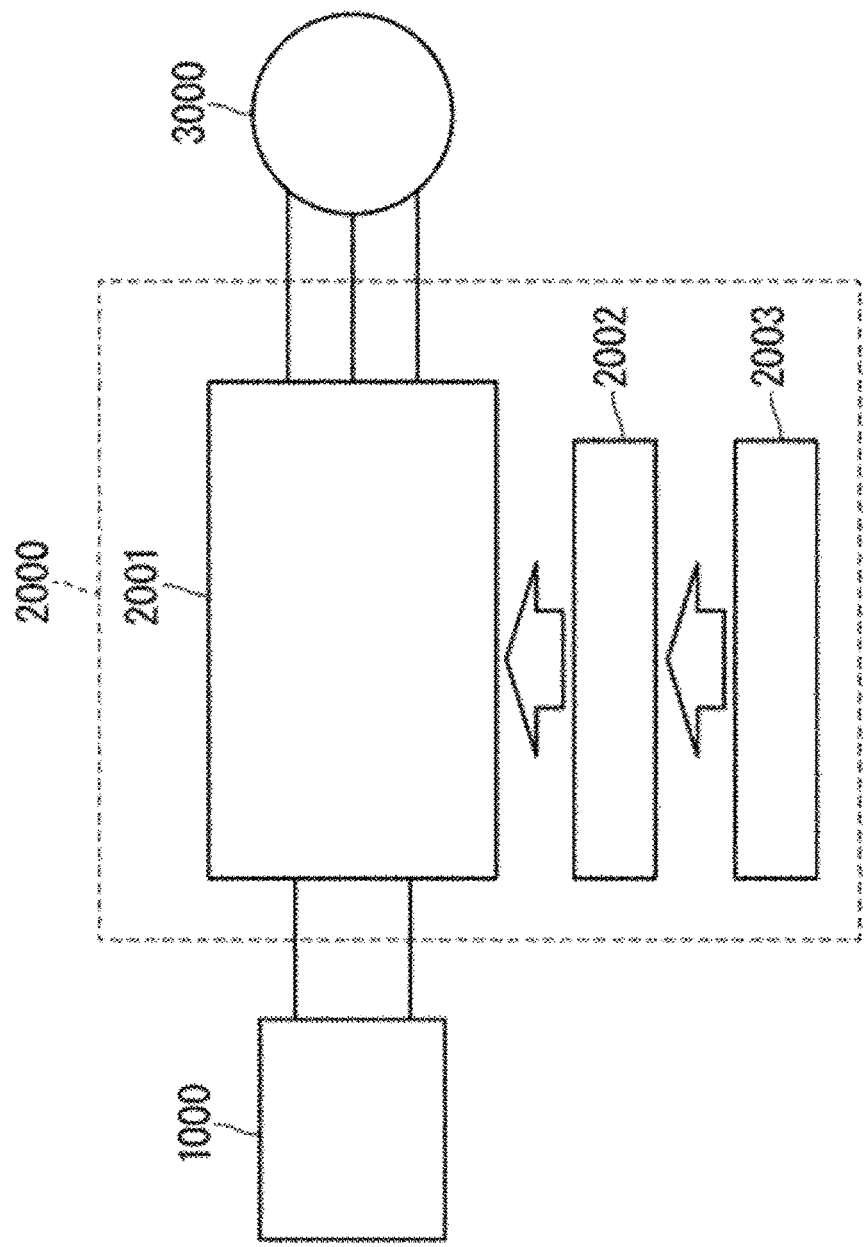
FIG. 12 is a block diagram schematically showing a configuration of a power conversion system to which a power converter according to Embodiment 5 is applied.

FIG. 12 is a block diagram schematically showing a configuration of a power conversion system to which a power converter 2000 according to Embodiment 5 is applied. The power conversion system includes a power source 1000, the power converter 2000, and a load 3000. The power supply 1000 is a DC power source that supplies DC power to the power converter 2000. The power supply 1000 is various and may be configured, for example, as a DC system, a solar cell, or a storage battery, and further may be configured with a rectifier circuit or an AC/DC converter connected to an AC system. Further, the power supply 1000 may be configured with a DC/DC converter that converts the DC power outputted from a DC system into a predetermined power.

The power converter 2000, which is a three-phase inverter connected between the power supply 1000 and the load 3000, converts the DC power supplied from the power supply 1000 into AC power to supply the AC power to the load 3000. As shown in FIG. 12, the power converter 2000 includes a main conversion circuit 2001 to convert inputted DC power to AC power to output the AC power, a drive circuit 2002 to output a drive signal for driving each switching device of the main conversion circuit 2001, and a control circuit 2003 to output a control signal for controlling the drive circuit 2002 to the drive circuit 2002. The load 3000 is a three-phase electric motor driven by the AC power supplied from the power converter 2000. Note that the load 3000 is an electric motor installed in various electrical equipment, not being limited to any specific application. For example, it is an electric motor used in a hybrid car, an electric car, a railroad car, an elevator, or air conditioning equipment, etc.

The following is a detailed description of the power converter 2000. The main conversion circuit 2001, which includes a switching device and a freewheel diode (both not shown), converts the DC power supplied from the power supply 1000 to AC power by the switching operation of the switching device and supplies the AC power to the load 3000. The specific circuit configurations of the main conversion circuit 2001 are various. The main conversion circuit 2001 according to Embodiment 5 is a three-phase full-bridge circuit with two levels and includes six switching devices and six freewheel diodes each connected in reverse parallel to one of the switching devices. The semiconductor device according to any one of Embodiments 1 through 4 above is applied to at least one of the switching devices and the freewheel diodes included in the main conversion circuit 2001. The six switching devices are combined into pairs. In each pair, the switching devices are connected in series to form a pair of upper and lower arms. Each pair of the upper and lower arms constitutes a phase (U-phase, V-phase, or W-phase) of the full bridge circuit. The output terminals of the pairs of the upper and lower arms, in other words, the three output terminals of the main conversion circuit 2001, are connected to the load 3000.

The drive circuit 2002 generates a drive signal to drive the switching devices of the main conversion circuit 2001 and supplies it to the control electrodes of the switching devices of the main conversion circuit 2001. Specifically, the drive circuit outputs a drive signal to turn on a switching device and a drive signal to turn off a switching device to their control electrodes in accordance with the control signal from the control circuit 2003 to be described later. The drive signal to keep a switching device in an ON state is a voltage signal (ON signal) above the threshold voltage of the switching device. The drive signal to keep the switching device in an OFF state is a voltage signal (OFF signal) below the threshold voltage of the switching device. The control circuit 2003 controls the switching devices of the main conversion circuit 2001 so that the load 3000 is supplied with the power it needs.

Specifically, the control circuit 2003 calculates the time (ON time) when each of the switching devices of the main conversion circuit 2001 should be in an ON state on the basis of the power to be supplied to the load 3000. For example, pulse width modulation (PWM) control, in which ON time of each switching device is modulated in accordance with the voltage to be outputted, can be applied to the control of the main conversion circuit 2001. A control signal is outputted as a control command to the drive circuit 2002 in a timely manner so that an ON signal is outputted to the switching device that should be in an ON state and an OFF signal is outputted to the switching device that should be in an OFF state. The drive circuit 2002 outputs the ON signal or the OFF signal to the control electrode of each of the switching devices as a drive signal in accordance with the control signal.

In the power converter according to Embodiment 5, the semiconductor device according to any one of Embodiments 1 through 4 may be applied as a freewheel diode of the main conversion circuit 2001. Thus, when the semiconductor device according to any one of Embodiments 1 through 4 is applied to the power converter, the turn-off loss of the semiconductor device can be reduced with the configurations shown in Embodiments 1 through 4. This improves the loss reduction of the power converter.

In Embodiment 5, an example is described, in which the present disclosure is applied to a three-phase inverter with two levels. However, the present disclosure is not limited as such and can be applied to various power converters. For example, the power converter may be a multi-level power converter such as one with three levels. If power is supplied to a load of a single phase, the present disclosure may be applied to a single-phase inverter. The present disclosure can also be applied to a DC/DC converter or an AC/DC converter when supplying power to a DC load or the like. Not limited to application to an electric motor as the load, the power converter according to the present disclosure can be used, for example, as a power supply system of an electric discharge machine, a laser processing machine, an induction heating cooker, and a wireless power supply system, and also as a power conditioner of a photovoltaic power generation system and a power storage system.

The features of the semiconductor device according to Embodiments 1 through 4 above may be combined as appropriate to further enhance the effectiveness of the present disclosure. It is possible to combine them with another known technology, and it is also possible to omit or change part of the configurations to the extent that it does not depart from the gist of the present disclosure.

DESCRIPTION OF SYMBOLS

1*a* . . . first upper-surface region
1*b* . . . second upper-surface region
10*a* . . . upper-surface region
10*b* . . . lower-surface region
11, 11*a*, 11*b*, 11*c* . . . collector layer
12 . . . drift layer
14 . . . buffer layer
18 . . . source layer
20 . . . contact layer
22 . . . base layer
22*b* . . . deep base layer
24 . . . carrier accumulation layer
24*a* . . . first carrier accumulation layer
24*b* . . . second carrier accumulation layer
26 insulating film
28 . . . conductor
42 . . . interlayer insulating film
44 . . . emitter contact layer
46 . . . emitter electrode
50 . . . gate electrode
51*a* . . . first collector region
51*b* . . . second collector region
90 . . . trench gate
95 . . . bottom layer
99 . . . side wall layer
100, 101, 102, 200, 201, 300, 400 . . . semiconductor device
110, 110*a*, 110*b*, 110*c*, 111, 112, 210, 211, 310, 410 . . . hole discharge promoting structure
1000 . . . power supply
2000 . . . power converter
2001 . . . main conversion circuit
2002 . . . drive circuit
2003 . . . control circuit
3000 . . . load

The invention claimed is:

1. A semiconductor device comprising:
a buffer layer of a first conductivity type;
an upper-surface region on an upper-surface side from the buffer layer; and
a lower-surface region on a lower-surface side from the buffer layer, wherein
the upper-surface region comprises:
 a drift layer of the first conductivity type formed on the buffer layer;
 a base layer of a second conductivity type formed over the drift layer;
 a source layer of the first conductivity type and a contact layer of the second conductivity type formed on the base layer to be adjoining each other;
 a plurality of trench gates formed penetrating through and directly contacting the source layer, the contact layer, and the base layer to reach the drift layer and extending with spaces therebetween;
 an emitter contact layer formed on the source layer and the contact layer; and
 an emitter electrode formed on the emitter contact layer, and the lower-surface region comprises:
 a collector layer of the second conductivity type formed under the buffer layer; and
 a collector electrode formed under the collector layer, the collector layer including a first collector layer and a second collector layer formed alternately, the second collector layer having impurity concentration lower than that of the first collector layer, wherein the upper-surface region includes a first upper-surface region over the first collector layer and a second upper-surface region over the second collector layer, the second upper-surface region has a structure different from that of the first upper-surface region, and in the first upper-surface region, a hole discharge promoting structure to promote hole discharge in a region over the first collector layer compared to a case where a structure of the first upper-surface region is made identical to a structure of the second upper-surface region is formed.

2. The semiconductor device according to claim 1, wherein the hole discharge promoting structure in the first upper-surface region includes a structure in which a first carrier accumulation layer with impurity concentration higher than that of the drift layer is not formed between the drift layer and the base layer, in contrast to a structure in the second upper-surface region in which the first carrier accumulation layer is formed between the drift layer and the base layer.

3. The semiconductor device according to claim 2, wherein the hole discharge promoting structure includes a structure in which a second carrier accumulation layer of the first conductivity type with impurity concentration lower than that of the first carrier accumulation layer and higher than that of the drift layer is formed between the drift layer and the base layer in the first upper-surface region.

4. The semiconductor device according to claim 1, wherein the hole discharge promoting structure includes a structure in which the base layer formed over the drift layer in the first upper-surface region is a deep base layer deeper than the base layer formed over the drift layer in the second upper-surface region.

5. The semiconductor device according to claim 2, wherein the hole discharge promoting structure includes a structure in which the base layer formed over the drift layer in the first upper-surface region is a deep base layer deeper than the base layer formed over the drift layer in the second upper-surface region.

6. The semiconductor device according to claim 1, wherein a carrier accumulation layer of the first conductivity type with impurity concentration higher than that of the drift layer is formed between the drift layer and the base layer.

7. The semiconductor device according to claim 1, wherein the hole discharge promoting structure includes a structure in which first trench pitches which are spaces between the plurality of trench gates in the first upper-surface region are formed larger than second trench pitches which are spaces between the plurality of trench gates in the second upper-surface region.

8. The semiconductor device according to claim 2, wherein the hole discharge promoting structure includes a structure in which first trench pitches which are spaces between the plurality of trench gates in the first upper-surface region are formed larger than second trench pitches which are spaces between the plurality of trench gates in the second upper-surface region.

9. The semiconductor device according to claim 7, wherein the first trench pitches are formed in such a manner as to narrow step by step in a direction from the first collector layer to the second collector layer.

10. The semiconductor device according to claim 1, wherein the hole discharge promoting structure in the first upper-surface region includes a structure in which a bottom layer of the second conductivity type is formed at a bottom of each trench gate, a side wall layer of the second conductivity type is formed on a side wall of each trench gate, and the bottom layer is connected to the base layer between the plurality of trench gates via the side wall layer, in contrast to a structure in the second upper-surface region in which neither the bottom layer nor the side wall layer is formed.

11. The semiconductor device according to claim 2, wherein the hole discharge promoting structure in the first upper-surface region includes a structure in which a bottom layer of the second conductivity type is formed at a bottom of each trench gate, a side wall layer of the second conductivity type is formed on a side wall of each trench gate, and the bottom layer is connected to the base layer between the plurality of trench gates via the side wall layer, in contrast to a structure in the second upper-surface region in which neither the bottom layer nor the side wall layer is formed.

12. The semiconductor device according to claim 1, wherein the hole discharge promoting structure in the first upper-surface region includes a structure in which a number of emitter contacts is larger than that in a structure in the second upper-surface region.

13. The semiconductor device according to claim 2, wherein the hole discharge promoting structure in the first upper-surface region includes a structure in which a number of emitter contacts is larger than that in a structure in the second upper-surface region.

14. The semiconductor device according to claim 1, wherein the first collector layer and the second collector layer are formed alternately in an array direction of the plurality of trench gates orthogonal to an extending direction of the plurality of trench gates, and a pitch of a pattern where the first collector layer and the second collector layer are arranged in the collector layer is a combined length of a width of the first collector layer and a width of the second collector layer in the direction orthogonal to the extending direction of the plurality of trench gates.

15. The semiconductor device according to claim 2, wherein the first collector layer and the second collector layer are formed alternately in an array direction of the plurality of trench gates orthogonal to an extending direction of the plurality of trench gates, and a pitch of a pattern where the first collector layer and the second collector layer are arranged in the collector layer is a combined length of a width of the first collector layer and a width of the second collector layer in the direction orthogonal to the extending direction of the plurality of trench gates.

16. The semiconductor device according to claim 1, wherein the first collector layer and the second collector layer are formed alternately in an extending direction of the plurality of trench gates, and a pitch of a pattern where the first collector layer and the second collector layer are arranged in the collector layer is a combined length of a width of the first collector layer and a width of the second collector layer in the extending direction of the plurality of trench gates.

17. The semiconductor device according to claim 1, wherein the collector layer includes a first collector region and a second collector region formed alternately in an array direction of the plurality of trench gates orthogonal to an extending direction of the plurality of trench gates, the first collector region is a region in which the first collector layer and the second collector layer are formed alternately in the extending direction of the plurality of trench gates, the second collector region is a region in which the first collector layer is not formed and only the second collector layer is formed, and a pitch of a pattern where the first collector region and the second collector region are arranged in the collector layer is a combined length of a width of the first collector layer in the first collector region and a width of the second collector layer in the second collector region in the array direction of the plurality of trench gates.

18. The semiconductor device according to claim 14, wherein the pitch is 20 µm or larger.

19. A power apparatus comprising the semiconductor device according to claim 1.

20. The power apparatus according to claim 19, being a power converter and comprising:
- a main conversion circuit to convert input power for outputting the converted power;
- a drive circuit to output a drive signal for driving the semiconductor device, the drive signal being output to the semiconductor device; and
- a control circuit to output a control signal for controlling the drive circuit to the drive circuit.

21. The semiconductor device according to claim 1, wherein a ratio of a width of the first collector layer to a width of the second collector layer is 0.4:0.6 or larger.

* * * * *